(12) United States Patent
Ivanov

(10) Patent No.: US 8,319,553 B1
(45) Date of Patent: Nov. 27, 2012

(54) APPARATUS AND METHODS FOR BIASING AMPLIFIERS

(75) Inventor: Evgueni Ivanov, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/196,523

(22) Filed: Aug. 2, 2011

(51) Int. Cl.
*H03F 3/45* (2006.01)
(52) U.S. Cl. ........................ 330/257; 330/253
(58) Field of Classification Search .................. 330/253, 330/257, 261
See application file for complete search history.

(56) References Cited

U.S. PATENT DOCUMENTS

| | | | |
|---|---|---|---|
| 5,300,896 A | 4/1994 | Suesserman | |
| 6,249,696 B1 | 6/2001 | Olson et al. | |
| 6,396,343 B2 | 5/2002 | Chee | |
| 6,538,503 B2 | 3/2003 | Burt | |
| 6,559,720 B1 | 5/2003 | Huijsing et al. | |
| 6,600,373 B1* | 7/2003 | Bailey et al. | 330/260 |
| 6,844,775 B2 | 1/2005 | Doorenbos et al. | |
| 7,109,797 B1* | 9/2006 | Turvey | 330/258 |
| 7,148,734 B2 | 12/2006 | Tanzawa | |
| 7,167,029 B2 | 1/2007 | Soeraasen | |
| 7,167,051 B2 | 1/2007 | Botker | |
| 7,193,457 B2 | 3/2007 | Douts et al. | |
| 7,202,738 B1* | 4/2007 | Huijsing et al. | 330/253 |
| 7,368,999 B2 | 5/2008 | Natzke | |
| 7,453,305 B2 | 11/2008 | Moane et al. | |
| 7,521,994 B2 | 4/2009 | Theus et al. | |
| 7,633,317 B2 | 12/2009 | Miranda et al. | |
| 8,067,982 B2* | 11/2011 | Wei | 330/257 |
| 2006/0176109 A1 | 8/2006 | Huijsing et al. | |
| 2007/0013440 A1 | 1/2007 | Chen et al. | |
| 2008/0061857 A1 | 3/2008 | Kapusta | |

OTHER PUBLICATIONS

Stitt, R. Mark *AC Coupling Instrumentation and Difference Amplifiers* (1990) 4 pages (available at World Wide Web page: ti.com/analog/docs/litabsmultiplefilelist.tsp?literatureNumber=sboa003&docCategoryId=1&familyId=1613).

Fortunato, Mark, *A New filter Topology for Analog High-Pass Filters* (2008) 8 pages (available at World Wide Web page: ti.com/lit/an/slyt299/slyt299.pdf).

Analog Devices AD8129/AD8130 Data sheet *Low Cost 270 MHz Differential Receiver Amplifiers* 40 pages (available at World Wide Web page: analog.com/en/specialty-amplifiers/differential-amplifiers/ad8130/products/product.html).

Texas Instruments INA333 Datasheet, *Micro-Power (50 μA), ZerØ-Drift-to-Rail Out Instrumentation Amplifier* (Oct. 2008), 26 pages (available at World Wide Web page: ti.com/lit/ds/symlink/ina333.pdf).

(Continued)

*Primary Examiner* — Khanh V Nguyen
(74) *Attorney, Agent, or Firm* — Knobbe Martens Olson & Bear LLP

(57) ABSTRACT

Apparatus and methods for biasing amplifiers are provided. In certain implementations, a bias circuit is provided for controlling the drain-source voltage of input transistors electrically connected to the inputs of a transconductance amplification circuit. For example, the bias circuit can maintain a relatively constant drain-source voltage in the input transistors by using a feedback loop that includes a feedback amplifier for adjusting the bias current of the input transistors based upon a difference between the drain and source voltages of the input transistors. In certain implementations, the feedback amplifier has an offset voltage equal to about the desired value of the drain-source voltage, and the feedback amplifier is configured to adjust the bias current until the difference between the inputs of the feedback amplifier is equal to about the offset voltage.

24 Claims, 9 Drawing Sheets

OTHER PUBLICATIONS

Fan et al., *A 1.8 µW 60 nV/√Hz Capacitively-Coupled Chopper Instrumentation Amplifier in 65 nm CMOS for Wireless Sensor Nodes*, IEEE Journal of Solid-State Circuits, vol. 46, No. 7 (Jul. 2011), 10 pages.

Kwan et al., *An Adaptive Analog Continuous-Time CMOS Biquadratic Filter*, IEEE Custom Integrated Circuits Conference (1991), 4 pages.

Gregoire, Robert, *An Over-60 dB True Rail-to-Rail Performance Using Correlated Level Shifting and Opamp With Only 30 DB Loop Gain*, IEEE International Solid-State Circuits Conference (2008), 3 pages.

Yazicioglu R.F. et al., *A 60 µW 60nV/√Hz Readout Front-End for Portable Biopotential Acquisition Systems*, IEEE Journal of Solid-State Circuits, vol. 42, No. 5 (May 2007), 11 pages.

van den Dool et al., *Indirect Current-Feedback Instrumentation Amplifier With a Common-Mode Input Range that Includes the Negative Rail*, IEEE Journal of Solid-State Circuits, vol. 28, No. 7 (Jul. 1993), 7 pages.

Kitchin et al., *A Designer's Guide to Instrumentation Amplifiers*, 3rd Edition (2006), 130 pages (available at World Wide Web page: analog.com/en/specialty-amplifiers/current-sense-amplifiers/products/design- handbooks/cu_dh_designers_guide_to_instrumentation_amps/resources/fca.html).

Song et al., *A Robust Rail-to-Rail Input Stage with Constant-$g_m$ and Constant Slew Rate Using a Novel Level Shifter*, IEEE International Symposium on Circuits and Systems (2007), 4 pages.

Wand et al., *Low-Power Instrumental Amplifier for Portable ECG*, IEEE Circuits and Systems International Conference on Testing and Diagnostics (2009), 4 pages.

\* cited by examiner

APPARATUS AND METHODS FOR BIASING AMPLIFIERS

BACKGROUND

1. Field

Embodiments of the invention relate to electronic devices, and more particularly, to bias circuits for amplifiers.

2. Description of the Related Technology

An amplifier, such as an operational amplifier or an instrumentation amplifier, can include one or more transconductance amplification blocks to aid in achieving a desired performance characteristic. For example, the amplifier can include a pair of transconductance amplification blocks arranged in an indirect current-feedback configuration to improve the operational input voltage range of the amplifier.

Including one or more transconductance amplification blocks in an amplifier can impact the amplifier's performance. For example, variation in drain current and/or drain-source voltage of field-effect transistors disposed at the inputs of the transconductance amplification block can impact the nonlinearity and/or common-mode rejection ratio (CMRR) of the amplifier.

There is a need for transconductance amplification blocks having improved performance. Additionally, there is need for amplifiers having improved linearity, CMRR, and that can operate over a wide range of input voltages.

SUMMARY

In one embodiment, an apparatus includes a first transconductance amplifier having a first voltage input, a second voltage input, a first current output, and a second current output. The first transconductance amplifier includes a resistor and a first transistor having a gate, a drain, and a source, the gate electrically connected to the first voltage input. The first transconductance amplifier further includes a second transistor having a gate, a drain, and a source, the gate electrically connected to the second voltage input. The first and second transistors are configured to generate a voltage across the resistor resulting in a current, and a difference in output currents between the first and second current outputs corresponds to the current. The first transconductance amplifier further includes a third transistor having a gate, a drain, and a source and a first amplifier having a first input, a second input, and an output, the first and second inputs electrically connected to the drain and to the source of the first transistor, respectively. The drain and the source of the third transistor are disposed in a signal path between the source of the first transistor and the first current output, and the first amplifier is configured to control the voltage of the gate of the third transistor so as to control a difference in voltage between the drain and the source of the first transistor. The first transconductance amplifier further includes a fourth transistor having a gate, a drain, and a source and a second amplifier having a first input, a second input, and an output, the first and second inputs electrically connected to the drain and to the source of the second transistor, respectively. The drain and the source of the fourth transistor are disposed between the source of the second transistor and the second current output, and the second amplifier is configured to control the voltage of the gate of the fourth transistor so as to control a difference in voltage between the drain and the source of the second transistor.

In another embodiment, a method includes biasing a transconductance amplifier is provided. The method includes amplifying a differential input voltage using a first metal oxide semiconductor (MOS) transistor and a second MOS transistor to generate a voltage across a resistor. The method further includes generating a current using the resistor based on the voltage across the resistor. At least a portion of the current is configured to pass through a source and a drain of a third MOS transistor and through a source a drain of fourth MOS transistor to generate a differential output current. The method further includes controlling a voltage of the gate of the third MOS transistor using a first amplifier having a first input electrically coupled to a source of the first MOS transistor and a second input electrically coupled to a drain of the first MOS transistor. The first amplifier controls the gate of the third MOS transistor so as to control a difference in voltage between the drain and the source of the first MOS transistor. The method further includes controlling a voltage of the gate of the fourth MOS transistor using a second amplifier having a first input electrically coupled to a source of the second MOS transistor and a second input electrically coupled to a drain of the second MOS transistor. The second amplifier controls the gate of the fourth MOS transistor so as to control a difference in voltage between the drain and the source of the second MOS transistor.

In another embodiment, an apparatus includes a first transconductance amplifier having a first voltage input, a second voltage input, a first current output, and a second current output. The first transconductance amplifier includes a resistor and a first transistor having a gate, a drain, and a source, the gate electrically connected to the first voltage input. The first transconductance amplifier further includes a second transistor having a gate, a drain, and a source, the gate electrically connected to the second voltage input. The first and second transistors are configured to generate a voltage across the resistor resulting in a current, and a difference in output currents between the first and second current outputs corresponds to the current. The first transconductance amplifier further includes a first means for controlling having a first input, a second input, and an output, the first and second inputs electrically connected to the drain and to the source of the first transistor, respectively. The first transconductance amplifier further includes a third transistor having a gate, a drain, and a source. The drain and the source of the third transistor are disposed in a signal path between the source of the first transistor and the first current output, and the first controlling means is configured to control the voltage of the gate of the third transistor so as to control a difference in voltage between the drain and the source of the first transistor. The first transconductance amplifier further includes a second means for controlling having a first input, a second input, and an output, the first and second inputs electrically connected to the drain and to the source of the second transistor, respectively. The first transconductance amplifier further includes a fourth transistor having a gate, a drain, and a source. The drain and the source of the fourth transistor are disposed between the source of the second transistor and the second current output. The second controlling means is configured to control the voltage of the gate of the fourth transistor so as to control a difference in voltage between the drain and the source of the second transistor

DETAILED DESCRIPTION OF EMBODIMENTS

Figure 1:
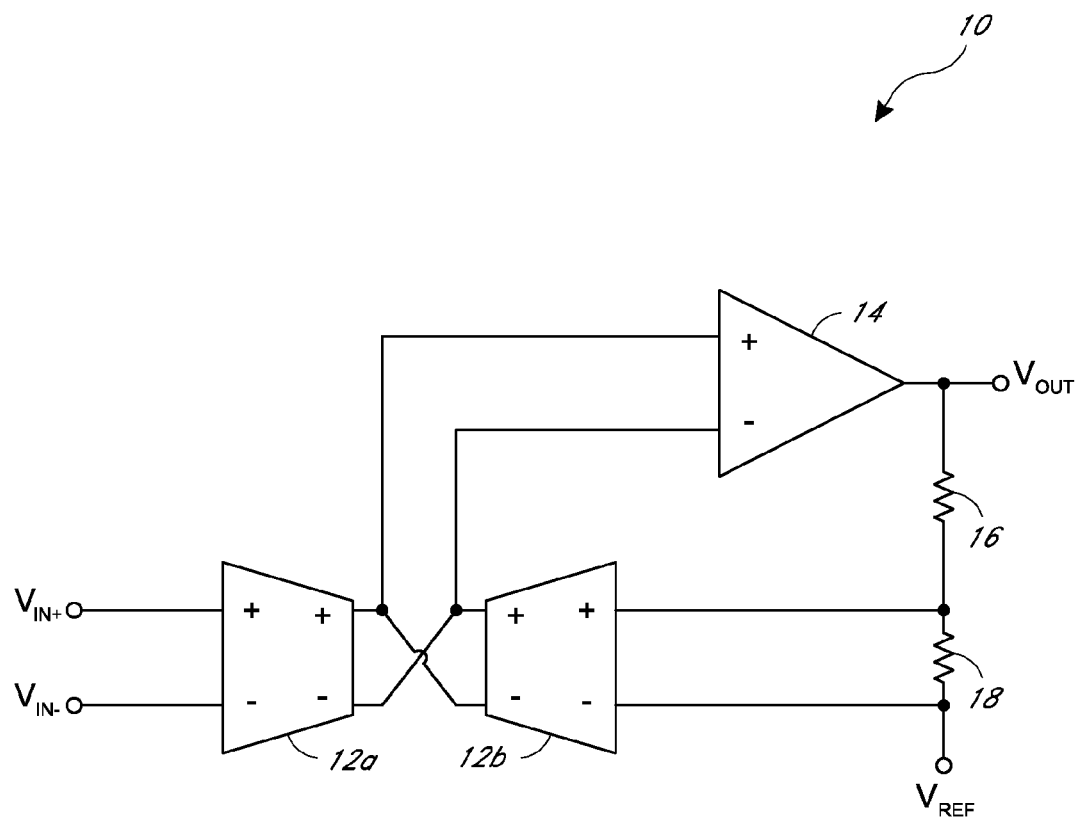
FIG. 1 is a schematic block diagram of one example of an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of One Example of an Amplifier

FIG. 1 is a schematic block diagram of one example of an amplifier 10. The amplifier 10 includes a first transconductance amplification block 12a, a second transconductance amplification block 12b, a transimpedance amplification block 14, a first resistor 16, and a second resistor 18. The amplifier 10 includes a positive or non-inverted input voltage terminal $V_{IN+}$, a negative or inverted input voltage terminal $V_{IN-}$, an output voltage terminal $V_{OUT}$, and a reference voltage terminal $V_{REF}$. The amplifier 10 can receive a differential input voltage signal between the positive and negative input voltage terminals $V_{IN+}$, $V_{IN-}$ and can amplify the differential input voltage signal to generate an output voltage signal on the output voltage terminal $V_{OUT}$.

The first and second transconductance amplification blocks 12a, 12b each include a non-inverted voltage input, an inverted voltage input, a non-inverted current output, and an inverted current output. The transimpedance amplification block 14 includes a non-inverted current input, an inverted current input, and a voltage output. The non-inverted and inverted voltage inputs of the first transconductance amplification block 12a are electrically connected to the positive and negative input voltage terminals $V_{IN+}$, $V_{IN-}$, respectively. The non-inverted current output of the first transconductance amplification block 12a is electrically connected to the non-inverted current input of the transimpedance amplification block 14 and to the inverted current output of the second transconductance amplification block 12b. The inverted current output of the first transconductance amplification block 12a is electrically connected to the inverted current input of the transimpedance amplification block 14 and to the non-inverted current output of the second transconductance amplification block 12b. The voltage output of the transimpedance amplification block 14 is electrically connected to the output voltage terminal $V_{OUT}$ and to a first end of the first resistor 16. The first resistor 16 further includes a second end electrically connected to a first end of the second resistor 18 and to the non-inverted voltage input of the second transconductance amplification block 12b. The second resistor 18 further includes a second end electrically connected to the inverted voltage input of the second transconductance amplification block 12b and to the reference voltage terminal $V_{REF}$.

As persons having ordinary skill in the art will appreciate, the illustrated amplifier 10 is electrically connected in an indirect current feedback configuration. For example, the voltage output of the transimpedance amplification block 14 is electrically coupled to the voltage inputs of the second transconductance amplification block 12b using the first and second resistors 16, 18, and the current outputs of the second transconductance amplification block 12b are electrically coupled to the current inputs of the transimpedance amplification block 14.

The first and second resistors 16, 18 can be used to control the gain of the amplifier 10. For example, when a differential input voltage is received on the positive and negative voltage terminals $V_{IN+}$, $V_{IN-}$, the differential output current of the first transconductance amplification block 12a can increase, thereby causing the transimpedance amplification block 14 to increase the voltage of the output voltage terminal $V_{OUT}$. The voltage of the output voltage terminal $V_{OUT}$ can increase until the differential voltage across the non-inverted and inverted voltage inputs of the second transconductance amplification block 12b is about equal to the differential input voltage. Since the ratio of the first and second resistors 16, 18 can determine the magnitude of the voltage of the output voltage terminal $V_{OUT}$ that corresponds to a change of voltage across the non-inverted and inverted voltage inputs of the second transconductance amplification block 12b, the first and second resistors 16, 18 can be used to control the gain of the amplifier 10. For example, in certain implementations, the gain of the amplifier 10 can be equal to about $1+R_{16}/R_{18}$, where $R_{16}$ is the resistance of the first resistor 16 and $R_{18}$ is the resistance of the second resistor 18.

The output offset voltage of the amplifier 10 can be controlled using the reference voltage terminal $V_{REF}$. For example, the voltage of the output terminal $V_{OUT}$ can be about equal to the voltage of the reference voltage terminal $V_{REF}$ when the differential input voltage between the positive and negative input voltage terminals $V_{IN+}$, $V_{IN-}$ is about equal to 0 V.

The non-linearity and/or common-mode rejection ratio (CMRR) of the first and second transconductance amplification blocks 12a, 12b can impact the performance of the amplifier 10. For example, in the illustrated configuration, the first transconductance amplification block 12a operates as a first amplification stage in the amplifier 10, and can introduce non-linear signal components that can be amplified by subsequent gain stages. Accordingly, there is a need for transconductance amplification circuits having improved non-linearity and/or CMRR.

Although the transconductance amplification circuits 12a, 12b have been illustrated in the context of the amplifier 10, transconductance amplification circuits can be employed in a wide array of ICs and other electronics configured to amplify electronic signals, including, for example, amplifiers having different circuit topologies.

Overview of Bias Circuits for Transconductance Amplification Circuits

Bias circuits for transconductance amplification circuits are disclosed herein. In certain implementations, a bias circuit is provided for controlling the drain-source voltage of transistors electrically connected to the inputs of a transconductance amplification circuit. For example, the bias circuit can maintain a relatively constant drain-source voltage in the input transistors by using feedback loops that include feedback amplifiers for adjusting the bias current of the input transistors based upon a difference between the drain and source voltages of the input transistors. In certain implementations, the feedback amplifier has an offset voltage about equal to the desired drain-source voltage, and each feedback amplifier is configured to adjust the bias current until the difference between the inputs of the feedback amplifier is about equal to the offset voltage. To aid in improving loop stability, current-input feedback amplifiers are used in certain configurations. In one embodiment, relatively high impedance current sources are provided at the drains of the input transistors to aid in reducing the variation of the drain current of the input transistors.

FIGS. 2A-2D are circuit diagrams of transconductance amplification blocks according to various embodiments.

Figure 2A:
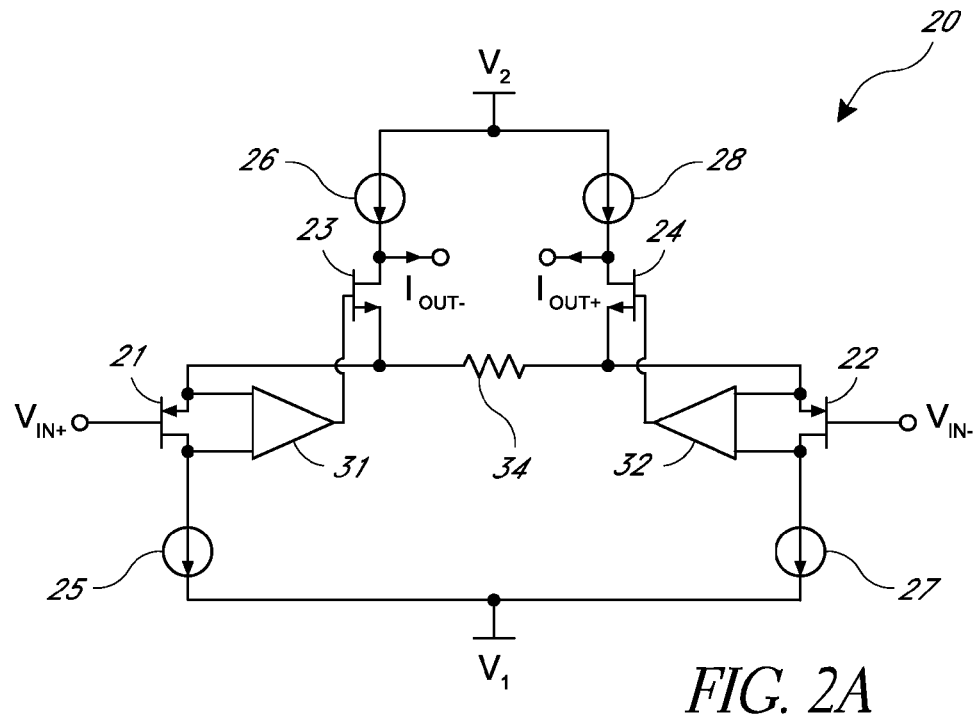
FIGS. 2A-2D are circuit diagrams of transconductance amplification blocks according to various embodiments.

FIG. 2A is a circuit diagram of a transconductance amplification block 20 according to one embodiment. The illustrated transconductance amplification block 20 includes first and second input p-type metal oxide semiconductor (PMOS) transistors 21, 22, first and second output n-type metal oxide semiconductor (NMOS) transistors 23, 24, first and second feedback amplifiers 31, 32, first to fourth current sources 25-28, and a resistor 34. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The transconductance amplification block 20 includes a positive or non-inverted voltage input $V_{IN+}$, a negative or inverted voltage input $V_{IN-}$, a positive or non-inverted current output $I_{OUT+}$ and a negative or inverted current output $I_{OUT-}$. The transconductance amplification block 20 can receive a differential input voltage signal between the non-inverted and inverted voltage inputs $V_{IN+}$, $V_{IN-}$ and can amplify the differential input voltage signal to generate a differential output current signal between the non-inverted and inverted current outputs $I_{OUT+}$, $I_{OUT-}$.

The first input PMOS transistor 21 includes a drain electrically connected to a first end of the first current source 25 and to a first input of the first feedback amplifier 31, a gate electrically connected to the non-inverted voltage input $V_{IN+}$, and a source electrically connected to a second input of the first feedback amplifier 31, to a source of the first output NMOS transistor 23, and to a first end of the resistor 34. The first current source 25 further includes a second end electrically connected to a first supply voltage $V_1$, which can be, for example, a ground supply or negative supply voltage. The first output NMOS transistor 23 further includes a gate electrically connected to an output of the first feedback amplifier 31 and a drain electrically connected to the inverted current output $I_{OUT-}$ and to a first end of the second current source 26. The second current source 26 further includes a second end electrically connected to a second supply voltage $V_2$, which can be, for example, a positive supply voltage.

The second input PMOS transistor 22 includes a drain electrically connected to a first end of the third current source 27 and to a first input of the second feedback amplifier 32, a gate electrically connected to the inverted voltage input $V_{IN-}$, and a source electrically connected to a second input of the second feedback amplifier 32, to a source of the second output NMOS transistor 24, and to a second end of the resistor 34. The second output NMOS transistor 24 further includes a gate electrically connected to an output of the second feedback amplifier 32 and a drain electrically connected to the non-inverted current output $I_{OUT+}$ and to a first end of the fourth current source 28. The fourth current source 28 further includes a second end electrically connected to the second supply voltage $V_2$, and the third current source 27 further includes a second end electrically connected to the first supply voltage $V_1$.

The first and second feedback amplifiers 31, 32 operate in a feedback loop that can be used to adjust the drain-source voltage of the first and second input PMOS transistors 21, 22, respectively. By controlling the drain-source voltage of the first and second input PMOS transistors 21, 22, the linearity of the transconductance amplification block 20 over a range of input differential voltage magnitudes can be improved. Additionally, by maintaining a relatively constant drain-source voltage across the first and second input PMOS transistors 21, 22, the common-mode rejection of the transconductance amplification block 20 can be enhanced. Improving the linearity and/or common-mode rejection of the transconductance amplification block 20 can aid in improving the overall performance of an amplifier using one or more of the transconductance amplification blocks 20.

The first and second feedback amplifiers 31, 32 can be configured to have an offset voltage that is about equal to the desired drain-source voltage of the first and second input PMOS transistors 21, 22, respectively. The first feedback amplifier 31 can sense the difference in voltage between the drain and the source of the first input PMOS transistor 21, and can control the gate voltage of the first output NMOS transistor 23 so that the difference between the source and drain of the first input PMOS transistor 21 is about equal to the offset voltage of the first feedback amplifier 31. Similarly, the second feedback amplifier 32 can sense the difference in voltage between the drain and the source of the second input PMOS transistor 22, and can control the gate voltage of the second output NMOS transistor 24 so that the difference between the source and drain of the second input PMOS transistor 22 is about equal to the offset voltage of the second feedback amplifier 32.

Accordingly, the first and second feedback amplifiers 31, 32 can be used to control the drain-source voltages of the first and second input PMOS transistors 21, 22, respectively. In one embodiment, the first and second feedback amplifiers 31, 32 are configured to have a voltage offset in the range of about 200 mV to about 400 mV.

The resistor 34 can aid in converting the input differential voltage ($V_{IN+}-V_{IN-}$) into the output differential current ($I_{OUT+}-I_{OUT-}$). For example, the voltage across the resistor 34 can change in relation to the difference between the gate voltages of the first and second input transistors 21, 22, which in turn can generate a difference between the channel currents of the first and second output NMOS transistors 23, 24 and a resulting output differential current. In one implementation, the transconductance value $G_M$ of the transconductance amplification block 20, or the ratio of the output differential current ($I_{OUT+}-I_{OUT-}$) to the input differential voltage ($V_{IN+}-V_{IN-}$) is about equal to $1/R_{34}$, where $R_{34}$ is the resistance of the resistor 34. In one embodiment, the resistor 34 has a resistance that is selected to be in the range of about 100Ω to about 1 MΩ. However, other resistance values will be readily determined by one of skill in the art. The resistor 34 can be formed from polysilicon and/or any other suitable resistive materials. In some implementations, the resistor 34 can be formed from an active element, such as a MOS transistor biased in a linear mode of operation.

The first and third current sources 25, 27 can be used to generate the drain currents of the first and second input PMOS transistors 21, 22, respectively. In certain implementations, the first and third current sources 25, 27 are configured to have a relatively high input impedance, such as an input impedance greater than about 100 kΩ, to aid in maintaining a relatively constant drain current for the first and second input PMOS transistors 21, 22 over a relatively wide range of input voltage conditions.

The magnitude of the first to fourth current sources 25-28 can be any suitable value. In one embodiment, the first to fourth current sources 25-28 each generate a current having a magnitude in the range of about 0.1 μA to about 10 mA. However, other current magnitudes will be readily determined by one of skill in the art.

In certain implementations, the first and second feedback amplifiers 31, 32 are current-input amplifiers to aid in improving the stability of the feedback loops associated with the amplifiers. For example, the feedback loops associated with the first and second feedback amplifiers 31, 32 can include low-frequency poles at the gates of the output NMOS transistors 23, 24 and at the drains of the input PMOS transistors 21, 22, respectively. By using current-input amplifiers in the feedback loops, the input impedance of the feedback amplifiers can be reduced, which can aid in increasing the frequency of the poles associated with the drains of the first and second input PMOS transistors 21, 22. Accordingly, using current-input amplifiers in the feedback loops can aid in stabilizing the feedback loops and/or reducing the power consumption needed to stabilize the feedback loops. In one embodiment, the first and second feedback amplifiers 31, 32 are current-input/voltage-output amplifiers having a transimpedance in the range of about 1 V/μA to about 1 V/pA.

In one embodiment, the first and second output NMOS transistors 23, 24 are low threshold voltage devices that have a threshold voltage with a magnitude that is less than a magnitude of the threshold voltage of the input PMOS transistors 21, 22. Reducing the magnitude of the threshold voltage of the output NMOS transistors 23, 24 can aid in increasing the operating common-mode voltage range at the inputs $V_{IN+}$, $V_{IN-}$. Accordingly, using low threshold voltage transistors for the first and second output NMOS transistors 23, 24 can also improve input voltage range. In one implementation, the magnitude of the threshold voltage of the first and second output NMOS transistors 23, 24 is about 200 mV to about 1.5 V less than the magnitude of the threshold voltage of the first and second input PMOS transistors 21, 22. In one embodiment, the low threshold voltage is achieved by using native transistors.

Figure 2B:
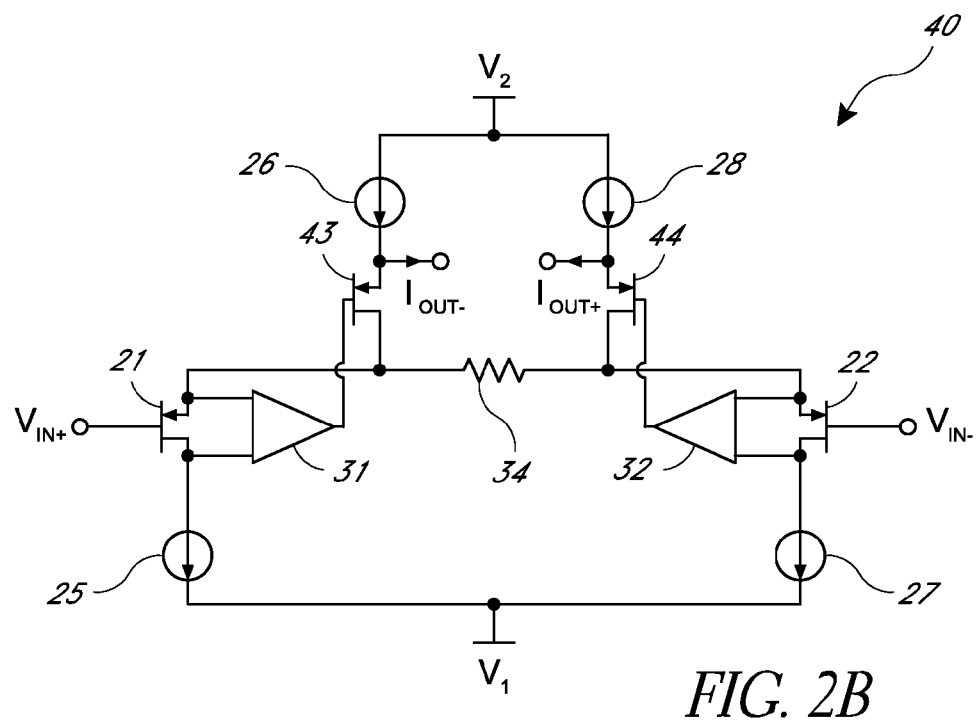

FIG. 2B is a circuit diagram of a transconductance amplification block 40 according to another embodiment. The illustrated transconductance amplification block 40 includes first and second output PMOS transistors 43, 44, the first and second input PMOS transistors 21, 22, the first and second feedback amplifiers 31, 32, the first to fourth current sources 25-28, and the resistor 34. The transconductance amplification block 40 includes the non-inverted voltage input $V_{IN+}$, the inverted voltage input $V_{IN-}$, the non-inverted current output $I_{OUT+}$ and the inverted current output $I_{OUT-}$.

The transconductance amplification block 40 of FIG. 2B is similar to the transconductance amplification block 20 of FIG. 2A. However, in contrast to the transconductance amplification block 20 of FIG. 2A that uses NMOS output transistors, the illustrated transconductance amplification block 40 of FIG. 2B uses PMOS output transistors. For example, the transconductance amplification block 40 includes the first output PMOS transistor 43 having a gate electrically connected to the output of the first feedback amplifier 31, a source electrically connected to the first end of the second current source 26 and to the inverted current output $I_{OUT-}$, and a drain electrically connected to the first end of the resistor 34, to the second input of the first feedback amplifier 31, and to the source of the first input PMOS transistor 21. Similarly, the transconductance amplification block 40 includes the second output PMOS transistor 44 having a gate electrically connected to the output of the second feedback amplifier 32, a source electrically connected to the first end of the fourth current source 28 and to the non-inverted current output $I_{OUT+}$, and a drain electrically connected to the second end of the resistor 34, to the second input of the second feedback amplifier 32, and to the source of the second input PMOS transistor 22. Additional details of the transconductance amplification block 40 can be similar to those described earlier with respect to FIG. 2A.

The transconductance amplification block 40 of FIG. 2B can have a relatively high operational input voltage range. For example, electrically connecting the sources of the first and second output PMOS transistors 43, 44 to the inverted and non-inverted current outputs $I_{OUT-}$, $I_{OUT+}$, respectively, can aid in enhancing the performance of the amplification block 40 when the common-mode voltage level at the voltage inputs $V_{IN+}$, $V_{IN-}$ is relatively high. Accordingly, in certain implementations, the transconductance amplification block 40 of FIG. 2B can have improved performance at relatively high input voltages compared to the transconductance amplification block 20 of FIG. 2A. However, electrically connecting the sources of the first and second output PMOS transistors 43, 44 to the inverted and non-inverted current outputs $I_{OUT-}$, $I_{OUT+}$, respectively, can also degrade stability of the feedback loops associated with the first and second feedback amplifiers 31, 32. Accordingly, the selection of a transconductance amplification block used in a particular electronic system can depend on a variety of factors.

Figure 2C:
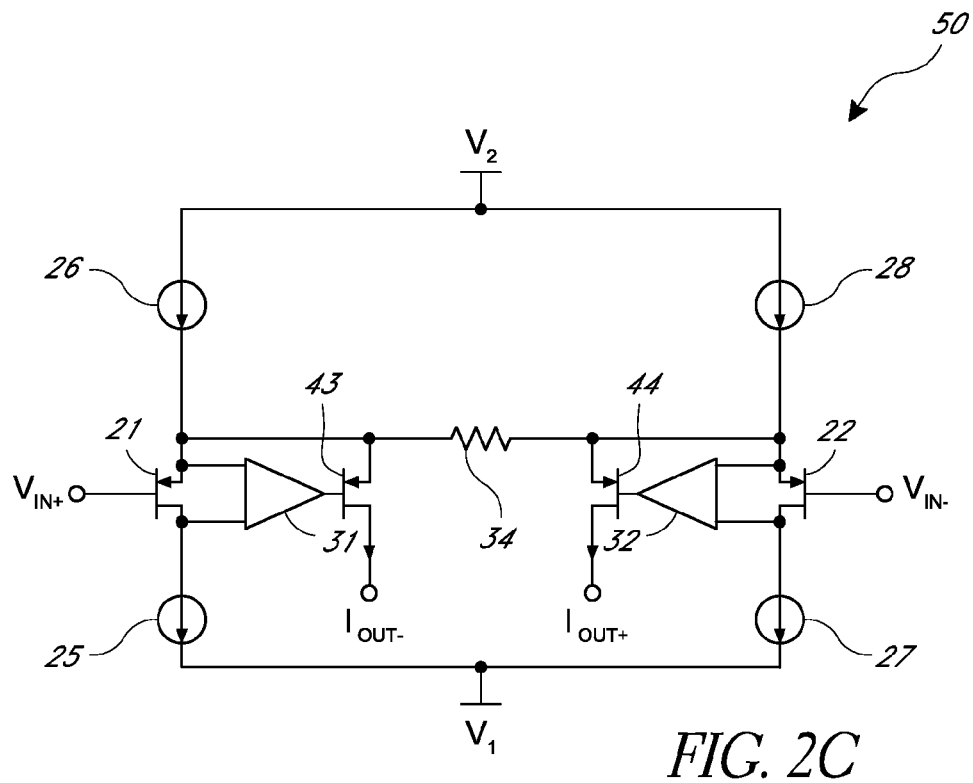

FIG. 2C is a circuit diagram of a transconductance amplification block 50 according to another embodiment. The illustrated transconductance amplification block 50 includes the first and second input PMOS transistors 21, 22, the first and second output PMOS transistors 43, 44, the first and second feedback amplifiers 31, 32, the first to fourth current sources 25-28, and the resistor 34. The transconductance amplification block 50 includes the non-inverted voltage input $V_{IN+}$, the inverted voltage input $V_{IN-}$, the non-inverted current output $I_{OUT+}$, and the inverted current output $I_{OUT-}$.

The first input PMOS transistor 21 includes a drain electrically connected to a first end of the first current source 25 and to a first input of the first feedback amplifier 31, a gate electrically connected to the non-inverted voltage input $V_{IN+}$, and a source electrically connected to a second input of the first feedback amplifier 31, to a source of the first output PMOS transistor 43, to a first end of the resistor 34, and to a first end of the second current source 26. The first current source 25 further includes a second end electrically connected to the first supply voltage $V_1$, and the second current source 26 further includes a second end electrically connected to the second supply voltage $V_2$. The first output PMOS transistor 43 further includes a gate electrically connected to an output of the first feedback amplifier 31 and a drain electrically connected to the inverted current output $I_{OUT-}$.

The second input PMOS transistor 22 includes a drain electrically connected to a first end of the third current source 27 and to a first input of the second feedback amplifier 32, a gate electrically connected to the inverted voltage input $V_{IN-}$, and a source electrically connected to a second input of the second feedback amplifier 32, to a source of the second output PMOS transistor 44, to a second end of the resistor 34, and to a first end of the fourth current source 28. The third current source 27 further includes a second end electrically connected to the first supply voltage $V_1$, and the fourth current source 28 further includes a second end electrically connected to the second supply voltage $V_2$. The second output PMOS transistor 44 further includes a gate electrically connected to an output of the second feedback amplifier 32 and a drain electrically connected to the non-inverted current output $I_{OUT+}$.

The transconductance amplification block 50 of FIG. 2C is similar to the transconductance amplification block 20 of FIG. 2A. However, in contrast to the transconductance amplification block 20 of FIG. 2A, the amplification block 50 of FIG. 2C uses a configuration in which output PMOS transistors are used rather than output NMOS transistors and in which the first end of the first and third current sources 26, 28 are electrically connected to the sources of the first and second output PMOS transistors 43, 44. Additional details of the transconductance amplification block 50 of FIG. 2C can be similar to that described earlier with respect to the transconductance amplification blocks of FIGS. 2A-2B.

Figure 2D:
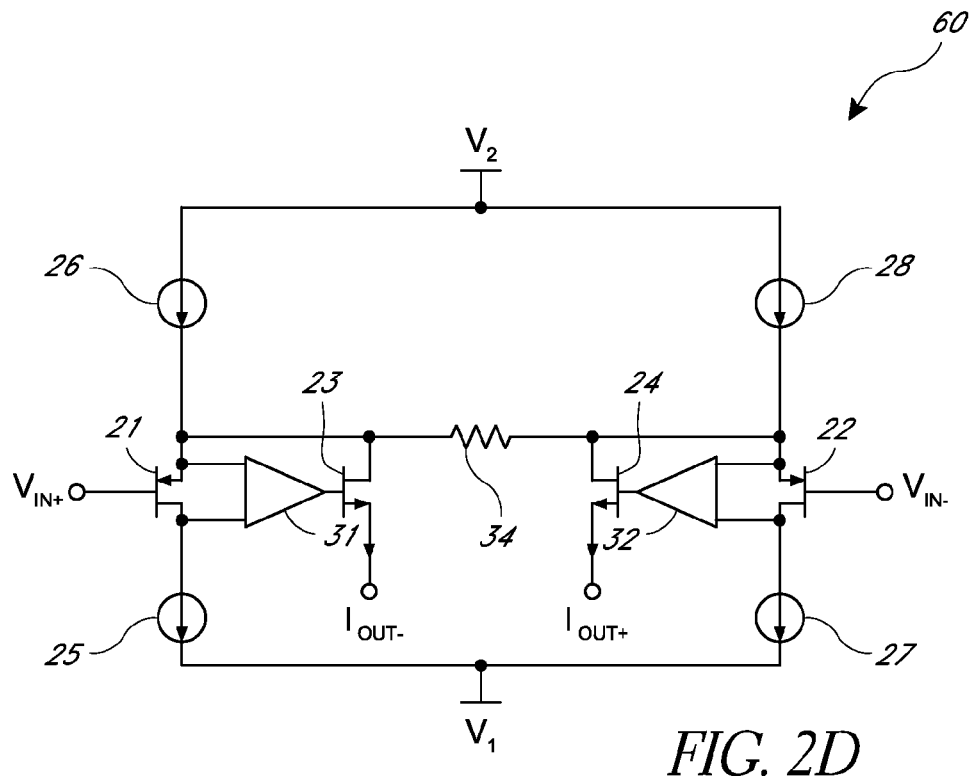

FIG. 2D is a circuit diagram of a transconductance amplification block 60 according to another embodiment. The illustrated transconductance amplification block 60 includes the first and second input PMOS transistors 21, 22, the first and second output NMOS transistors 23, 24, the first and second feedback amplifiers 31, 32, the first to fourth current sources 25-28, and the resistor 34. The transconductance amplification block 60 includes the non-inverted voltage input $V_{IN+}$, the inverted voltage input $V_{IN-}$, the non-inverted current output $I_{OUT+}$, and the inverted current output $I_{OUT-}$.

The transconductance amplification block 60 of FIG. 2D is similar to the transconductance amplification block 40 of FIG. 2B. However, in contrast to the amplification block 40 of FIG. 2B that uses PMOS output transistors, the illustrated amplification block 60 of FIG. 2D uses a configuration in which output NMOS transistors are used rather than output PMOS transistors and in which the first end of the first and third current sources 26, 28 are electrically connected to the drains of the first and second output NMOS transistors 23, 24, respectively. For example, the transconductance amplification block 60 includes the first output NMOS transistor 23 having a gate electrically connected to the output of the first feedback amplifier 31, a source electrically connected to the inverted current output $I_{OUT-}$, and a drain electrically connected to the first end of the resistor 34, to the second input of the first feedback amplifier 31, to the source of the first input PMOS transistor 21, and to a first end of the second current source 26. Similarly, the transconductance amplification block 60 includes the second output NMOS transistor 24 having a gate electrically connected to the output of the second feedback amplifier 32, a source electrically connected to the non-inverted current output $I_{OUT+}$, and a drain electrically connected to the second end of the resistor 34, to the second input of the second feedback amplifier 32, to the source of the second input PMOS transistor 22, and to a first end of the fourth current source 28. Additional details of the transconductance amplification block 60 can be similar to that described earlier with respect to FIGS. 2A-2C.

FIGS. 3A-3D are circuit diagrams of transconductance amplification blocks according to various embodiments.

Figure 3A:
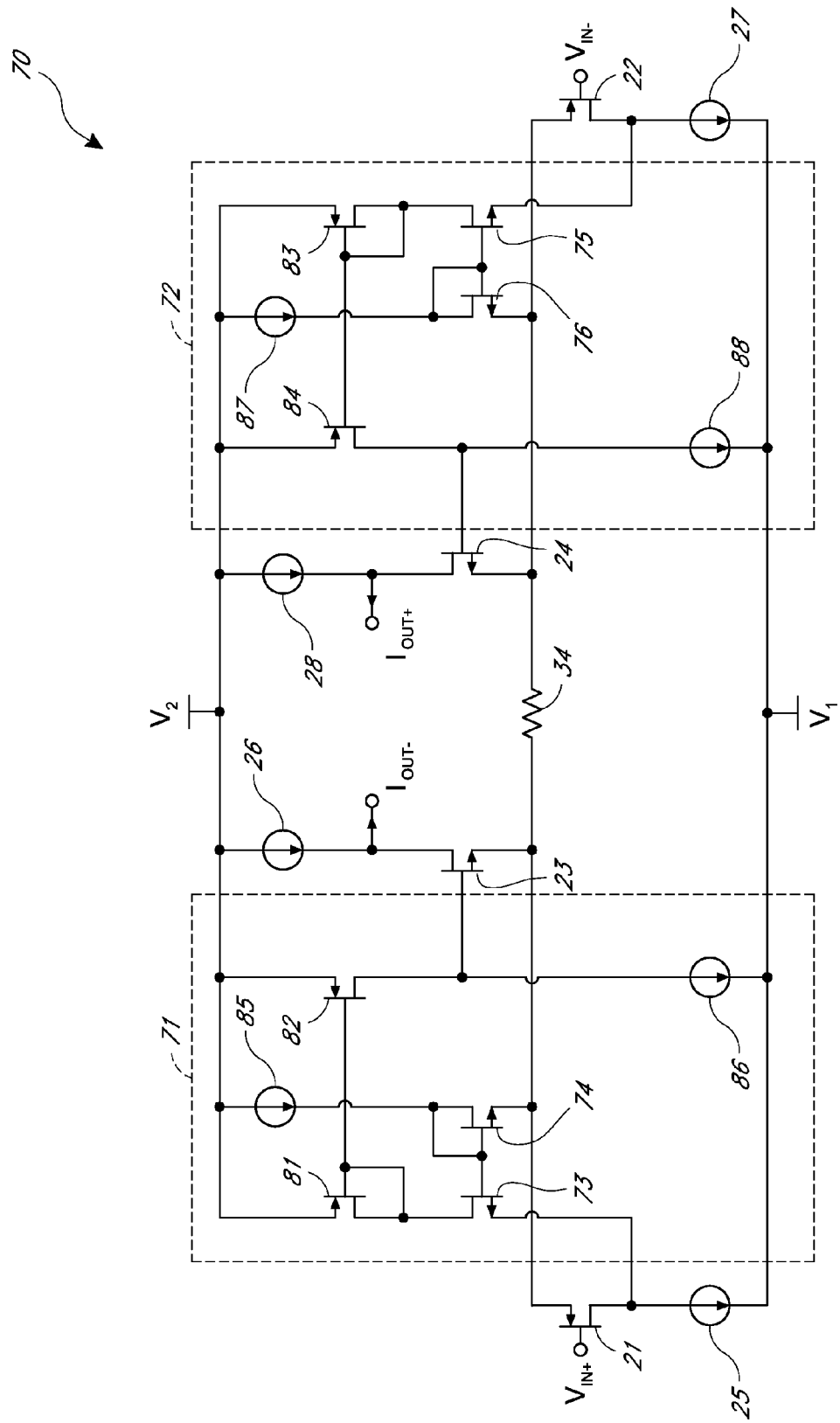
FIGS. 3A-3D are circuit diagrams of transconductance amplification blocks according to various embodiments.

FIG. 3A is a circuit diagram of a transconductance amplification block 70 according to another embodiment. The illustrated transconductance amplification block 70 includes the first and second input PMOS transistors 21, 22, the first and second output NMOS transistors 23, 24, first and second feedback amplifiers 71, 72, the first to fourth current sources 25-28, and the resistor 34. The transconductance amplification block 70 includes the non-inverted voltage input $V_{IN+}$, the inverted voltage input $V_{IN-}$, the non-inverted current output $I_{OUT+}$, and the inverted current output $I_{OUT-}$.

The transconductance amplification block 70 is electrically connected in the configuration described earlier with reference to FIG. 2A. The first and second feedback amplifiers 71, 72 of FIG. 3A illustrate one example of the first and second feedback amplifiers 31, 32 of FIG. 2A.

The first feedback amplifier 71 includes first and second NMOS transistors 73, 74, first and second PMOS transistors 81, 82, and fifth and sixth current sources 85, 86. The first NMOS transistor 73 includes a source electrically connected to the first end of the first current source 25 and to the drain of the first input PMOS transistor 21 at a first current input of the first feedback amplifier 71. The first NMOS transistor 73 further includes a gate electrically connected to a drain and a gate of the second NMOS transistor 74 and to a first end of the fifth current source 85. The first NMOS transistor 73 further includes a drain electrically connected to a gate of the second PMOS transistor 82 and to a gate and a drain of the first PMOS transistor 81. The second NMOS transistor 74 further includes a source electrically connected to the source of the first input PMOS transistor 21, to the source of the first NMOS output transistor 23, and to the first end of the resistor 34 at a second current input of the first feedback amplifier 71. The first and second PMOS transistors 81, 82 each include a source electrically connected to the second supply voltage $V_2$. The second PMOS transistor 82 further includes a drain electrically connected to a first end of the sixth current source 86 and to the gate of the first output NMOS transistor 23 at a voltage output of the first feedback amplifier 71. The fifth current source 85 further includes a second end electrically connected to the second supply voltage $V_2$, and the sixth current source 86 further includes a second end electrically connected to the first supply voltage $V_1$.

The second feedback amplifier 72 includes third and fourth NMOS transistors 75, 76, third and fourth PMOS transistors 83, 84, and seventh and eighth current sources 87, 88. The third NMOS transistor 75 includes a source electrically connected to the first end of the third current source 27 and to the drain of the second input PMOS transistor 22 at a first current input of the second feedback amplifier 72. The third NMOS transistor 75 further includes a gate electrically connected to a drain and a gate of the fourth NMOS transistor 76 and to a first end of the seventh current source 87. The third NMOS transistor 75 further includes a drain electrically connected to a gate of the fourth PMOS transistor 84 and to a gate and a drain of the third PMOS transistor 83. The fourth NMOS transistor 76 further includes a source electrically connected to the source of the second input PMOS transistor 22, to the source of the second output NMOS transistor 24, and to the second end of the resistor 34 at a second current input of the second feedback amplifier 72. The third and fourth PMOS transistors 83, 84 each include a source electrically connected to the second supply voltage $V_2$. The fourth PMOS transistor 84 further includes a drain electrically connected to a first end of the eighth current source 88 and to the gate of the second output NMOS transistor 24 at a voltage output of the second feedback amplifier 72. The seventh current source 87 further includes a second end electrically connected to the second supply voltage $V_2$, and the eighth current source 88 further includes a second end electrically connected to the first supply voltage $V_1$.

The first and second feedback amplifiers 71, 72 include current inputs that can be used to improve the stability of the feedback loops associated with the feedback amplifiers 71, 72. For example, the first and second feedback amplifiers 71, 72 include a low-frequency pole at the gate of the first and second output NMOS transistors 23, 24 and at the drain of the first and second input PMOS transistors 21, 22, respectively. By using current inputs rather than voltage inputs, the input impedance of the first and second feedback amplifiers 71, 72 can be reduced, which can aid in increasing the frequency of the poles associated with the drains of the first and second input PMOS transistors 21, 22. Since increasing the frequency of these poles can improve stability, using current-input feedback amplifiers can aid in stabilizing the feedback loops and/or reducing the power consumption needed to stabilize the feedback loops.

The first and second feedback amplifiers 71, 72 can be used to control the difference in voltage between the drain and the source of the first and second input PMOS transistors 21, 22, respectively. For example, the first feedback amplifier 71 can be used to control the voltage of the gate of the first output NMOS transistor 23 based on the difference in voltage between the drain and source of the first input PMOS transistor 21, and the second feedback amplifier 72 can be used to control the voltage of the gate of the second output NMOS transistor 24 based on the difference in voltage between the drain and source of the second input PMOS transistor 22.

The first and second feedback amplifiers 71, 72 can be configured to have an offset voltage about equal to the desired value of the drain-source voltage of the first and second input PMOS transistors 21, 22, respectively. Additionally, the first and second feedback amplifiers 71, 72 can be configured to adjust the gate voltage of the first and second output NMOS transistors 23, 24, respectively, until the difference between the drain and source voltages of the first and second input PMOS transistors 21, 22 is about equal to the offset voltage of the first and second feedback amplifiers 71, 72.

In one embodiment, the first and second feedback amplifiers 71, 72 are each configured to have a voltage offset in the range of about 200 mV to about 400 mV. The first and second feedback amplifiers 71, 72 can be configured to have a voltage offset using any suitable technique. In one implementation, the offset of the first and second feedback amplifiers 71, 72 is achieved by selecting the width and/or length of the first and third NMOS transistors 73, 75 relative to the width and/or length of the second and fourth NMOS transistor 74, 76. For example, in one implementation, the second and fourth NMOS transistors have a width-to-length ratio that is about 2 times to about 200 times greater than the width-to-length ratio of the first and third NMOS transistors 73, 75.

The magnitude of the fifth to eighth current sources 85-88 can be any suitable value. In one embodiment, the fifth to eighth current sources 85-88 each have a current magnitude in the range of about 10 nA to about 0.1 mA. However, other current magnitudes will be readily determined by one of skill in the art.

In one embodiment, the first and second output NMOS transistors 23, 24 are low threshold voltage MOS devices that have a threshold voltage having a magnitude that is less than a magnitude of the threshold voltage of the input PMOS transistors 21, 22. Reducing the threshold voltage of the output NMOS transistors 23, 24 can aid in improving input voltage range. Additionally, in certain implementations, the first to fourth NMOS transistors 73-76 of the first and second feedback amplifiers 71, 72 can be low threshold voltage MOS devices to help prevent the first and second feedback amplifiers 71, 72 from impacting the input voltage range. In one implementation, the magnitude of the threshold voltage of the first and second output NMOS transistors 23, 24 and the first to fourth NMOS transistors 73-76 is about 200 mV to about 1.5 V less than the magnitude of the threshold voltage of the first and second input PMOS transistors 21, 22.

Figure 3B:
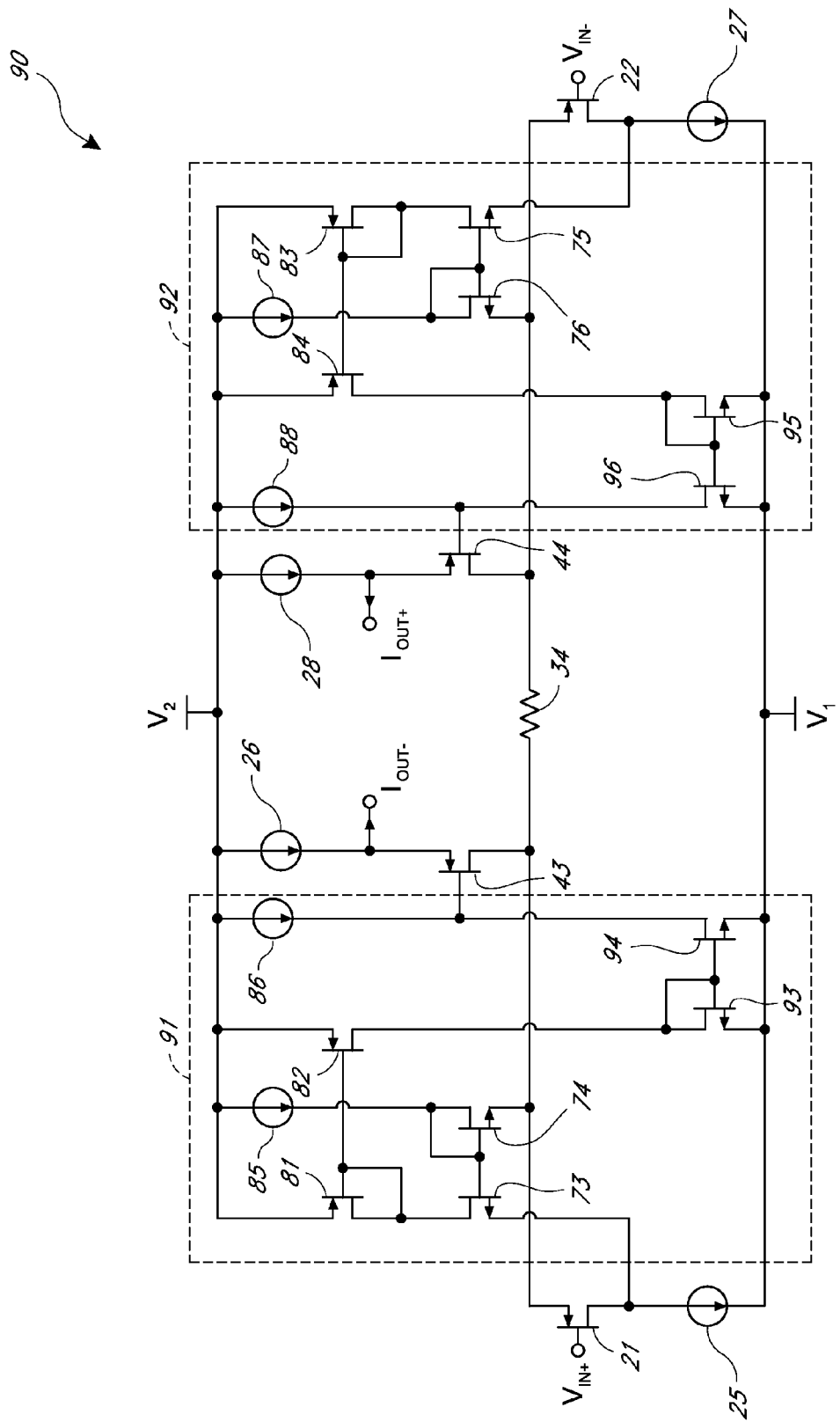

FIG. 3B is a circuit diagram of a transconductance amplification block 90 according to another embodiment. The illustrated transconductance amplification block 90 includes the first and second input PMOS transistors 21, 22, the first and second output PMOS transistors 43, 44, first and second feedback amplifiers 91, 92, the first to fourth current sources 25-28, and the resistor 34. The transconductance amplification block 90 includes the non-inverted voltage input $V_{IN+}$, the inverted voltage input $V_{IN-}$, the non-inverted current output $I_{OUT+}$, and the inverted current output $I_{OUT-}$.

The transconductance amplification block 90 of FIG. 3B is electrically connected in the configuration described above with reference to FIG. 2B. The first and second feedback amplifiers 91, 92 of FIG. 3B illustrate one example of the first and second feedback amplifiers 31, 32 of FIG. 2B.

The first feedback amplifier 91 includes the first and second NMOS transistors 73, 74, the first and second PMOS transistors 81, 82, fifth and sixth current sources 85, 86, and fifth and sixth NMOS transistors 93, 94. The second feedback amplifier 92 includes the third and fourth NMOS transistors 75, 76, the third and fourth PMOS transistors 83, 84, seventh and eighth current sources 87, 88, and seventh and eighth NMOS transistors 95, 96.

The first and second feedback amplifiers 91, 92 of FIG. 3B are similar to the first and second feedback amplifiers 71, 72 of FIG. 3A, except that the feedback amplifiers of FIG. 3B further include the fifth to eighth NMOS transistors 93-96. For example, as shown in FIG. 3B, the first feedback amplifier 91 includes the sixth NMOS transistor 94, which includes a source electrically connected to the source of the fifth NMOS transistor 93 and to the first supply voltage $V_1$, a gate electrically connected to the drain of the second PMOS transistor 82 and to the gate and drain of the fifth NMOS transistor 93, and a drain electrically connected to a first end of the sixth current source 86 and to a gate of the first output PMOS transistor 43 at a voltage output of the first feedback amplifier 91. Similarly, the second feedback amplifier 92 includes the eighth NMOS transistor 96, which includes a source electrically connected to a source of the seventh NMOS transistor 95 and to the first supply voltage $V_1$, a gate electrically connected to a drain of the fourth PMOS transistor 84 and to a gate and a drain of the seventh NMOS transistor 95, and a drain electrically connected to a first end of the eighth current source 88 and to the gate of the second output PMOS transistor 44 at a voltage output of the second feedback amplifier 92.

By including the fifth to eighth NMOS transistors 93-96 in the first and second feedback amplifiers 91, 92, the voltage outputs of the first and second feedback amplifiers 91, 92 of FIG. 3B have a polarity inverted relative to that of the feedback amplifiers 71, 72 of FIG. 3A. For example, the sixth and seventh NMOS transistors 93, 94 are configured to mirror the drain current of the second PMOS transistor 82 to aid in generating the output of the first feedback amplifier 91, and the eighth and ninth NMOS transistors 95, 96 are configured to mirror the drain current of the fourth PMOS transistor 84 to aid in generating the output of the second feedback amplifier 92. By including the additional current mirror, the outputs of the first and second feedback amplifiers 91, 92 of FIG. 3B are inverted relative to that of the feedback amplifiers 71, 72 of FIG. 3A, thereby aiding in obtaining the proper polarity of feedback at the gates of the output PMOS transistors 43, 44 of the transconductance amplification block 90.

Additional details of the first and second feedback amplifiers 91, 92 can be similar to those described earlier with respect to FIGS. 2A-3A.

Figure 3C:
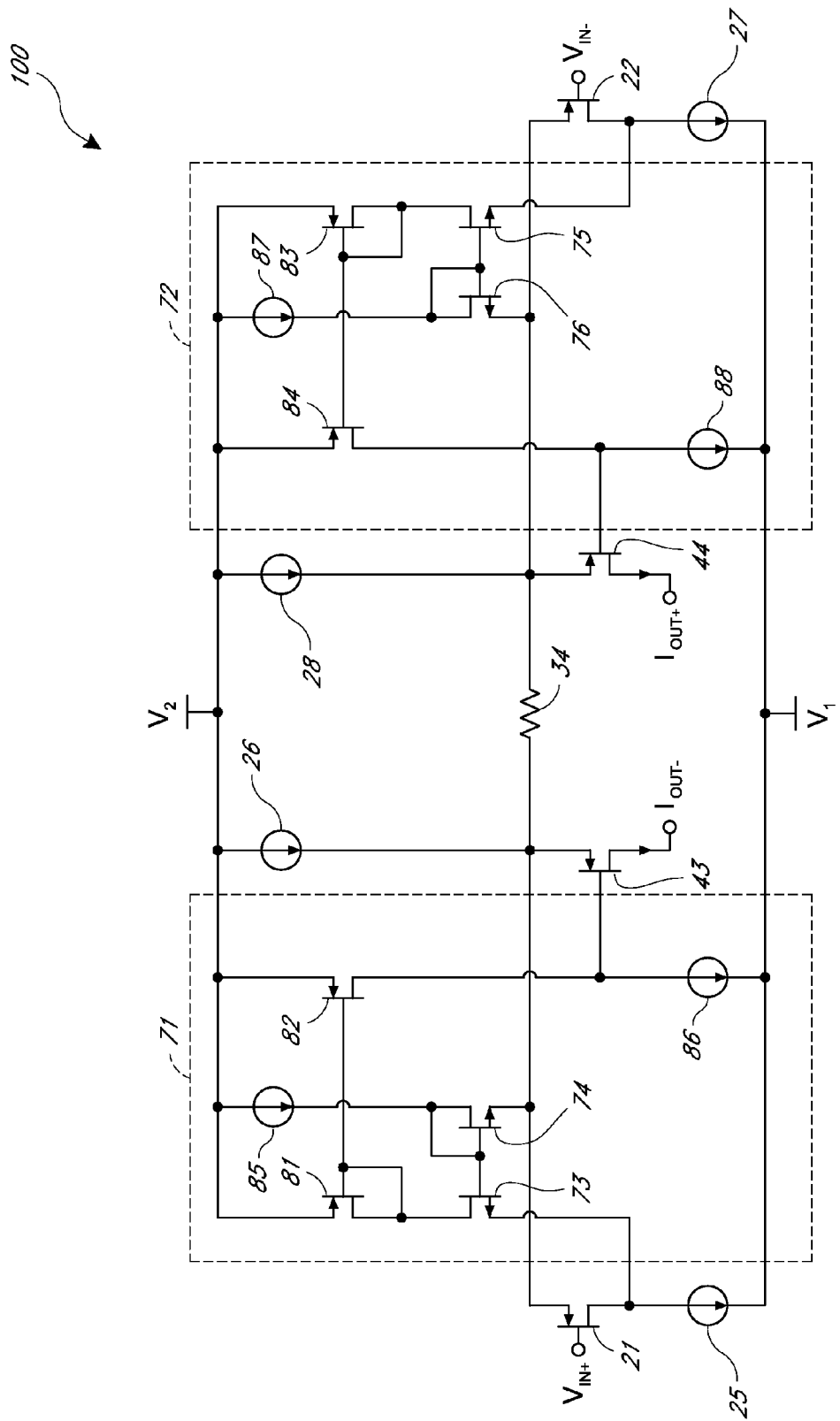

FIG. 3C is a circuit diagram of a transconductance amplification block 100 according to another embodiment. The illustrated transconductance amplification block 100 includes the first and second input PMOS transistors 21, 22, the first and second output PMOS transistors 43, 44, the first and second feedback amplifiers 71, 72, the first to fourth current sources 25-28, and the resistor 34. The transconductance amplification block 100 includes the non-inverted voltage input $V_{IN+}$, the inverted voltage input $V_{IN-}$, the non-inverted current output $I_{OUT+}$, and the inverted current output $I_{OUT-}$.

The transconductance amplification block 100 is electrically connected in the configuration described above with reference to FIG. 2C. The first and second feedback amplifiers 71, 72 can be as described above with reference to FIG. 3A.

Figure 3D:
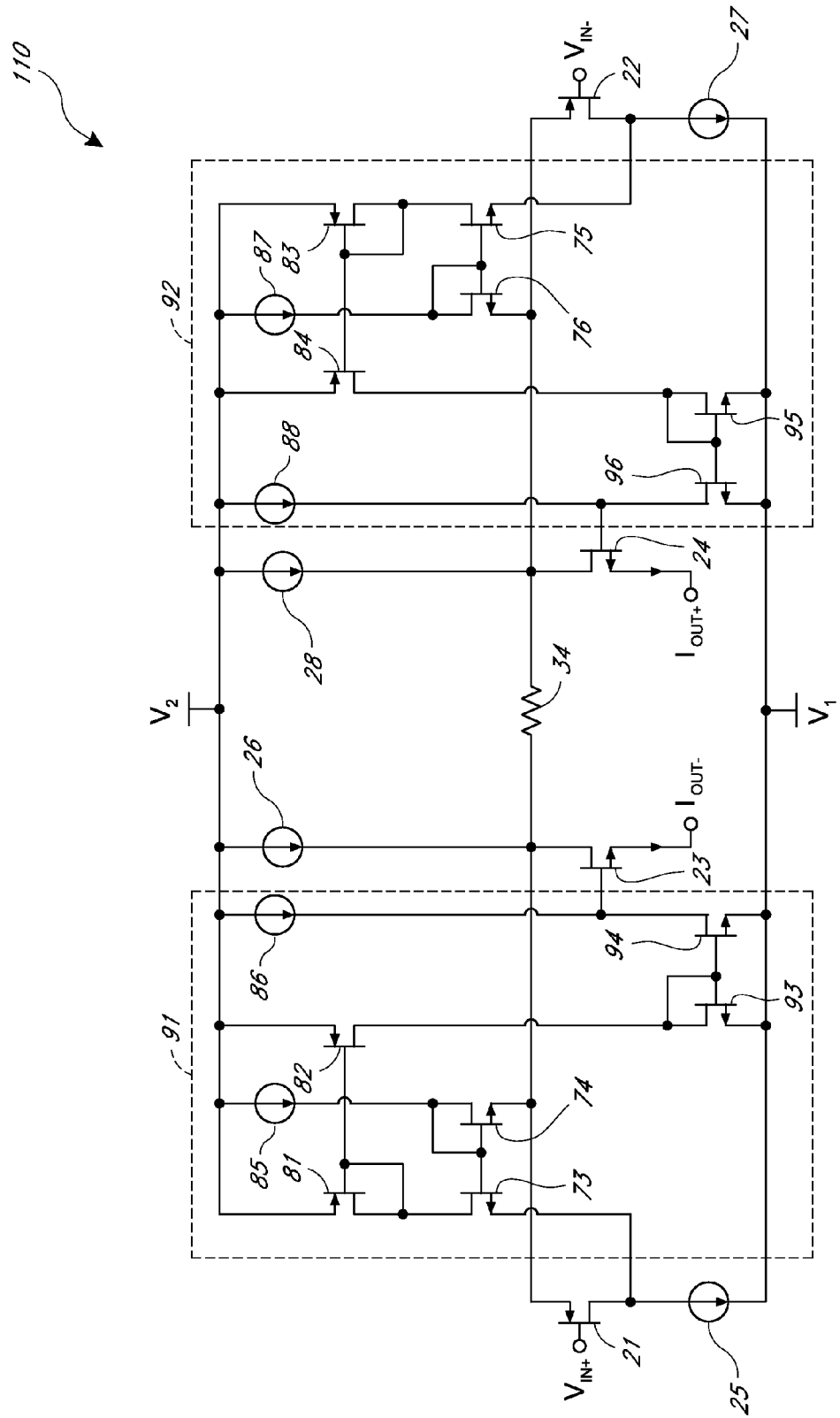

FIG. 3D is a circuit diagram of a transconductance amplification block 110 according to another embodiment. The illustrated transconductance amplification block 110 includes the first and second input PMOS transistors 21, 22, the first and second output NMOS transistors 23, 24, the first and second feedback amplifiers 91, 92, the first to fourth current sources 25-28, and the resistor 34. The transconductance amplification block 110 includes the non-inverted voltage input $V_{IN+}$, the inverted voltage input $V_{IN-}$, the non-inverted current output $I_{OUT+}$, and the inverted current output $I_{OUT-}$.

The transconductance amplification block 110 is electrically connected in the configuration described earlier with reference to FIG. 2D. The first and second feedback amplifiers 91, 92 can be as described above with reference to FIG. 3B.

Figure 4:
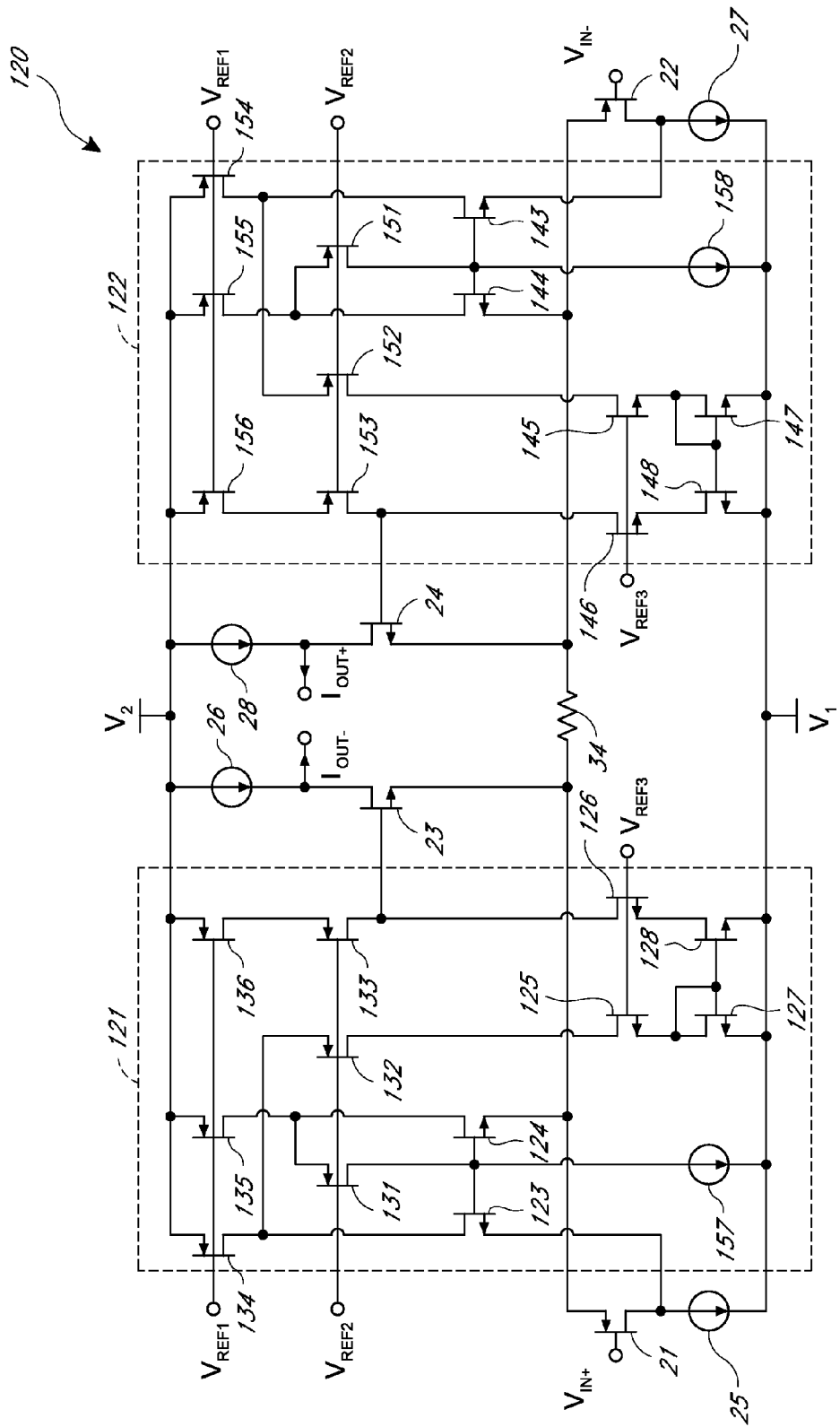
FIG. 4 is a circuit diagram of a transconductance amplification block according to another embodiment.

FIG. 4 is a circuit diagram of a transconductance amplification block 120 according to another embodiment. The illustrated transconductance amplification block 120 includes the first and second input PMOS transistors 21, 22, the first and second output NMOS transistors 23, 24, first and second feedback amplifiers 121, 122, the first to fourth current sources 25-28, and the resistor 34. The transconductance amplification block 120 includes the non-inverted voltage input $V_{IN+}$, the inverted voltage input $V_{IN-}$, the non-inverted current output $I_{OUT+}$, and the inverted current output $I_{OUT-}$.

The transconductance amplification block 120 is electrically connected in the configuration described earlier with reference to FIG. 2A. The first and second feedback amplifiers 121, 122 of FIG. 4 illustrate another example of the first and second feedback amplifiers 31, 32 of FIG. 2A.

The first feedback amplifier 121 includes first to sixth NMOS transistors 123-128, first to sixth PMOS transistors 131-136, and a fifth current source 157. The first NMOS transistor 123 includes a source electrically connected to the first end of the first current source 25 and to the drain of the first input PMOS transistor 21 at a first current input of the first feedback amplifier 121. The first NMOS transistor 123 further includes a gate electrically connected to the gate of the second NMOS transistor 124, to a drain of the first PMOS transistor 131, and to a first end of the fifth current source 157. The fifth current source 157 further includes a second end electrically connected to the first supply voltage $V_1$. The first NMOS transistor 123 further includes a drain electrically connected to a drain of a fourth PMOS transistor 134 and to a source of the second PMOS transistor 132. The second NMOS transistor 124 further includes a source electrically connected to the source of the first input PMOS transistor 21, to the source of the first NMOS output transistor 23, and to the first end of the resistor 34 at a second current input of the first feedback amplifier 121. The second NMOS transistor 124 further includes a drain electrically connected to a source of the first PMOS transistor 131 and to a drain of the fifth PMOS transistor 135.

The fourth to sixth PMOS transistors 134-136 each include a gate electrically connected to a first voltage reference $V_{REF1}$ and a source electrically connected to the second supply voltage $V_2$. The first to third PMOS transistors 131-133 each include a gate electrically connected to a second voltage reference $V_{REF2}$. The second PMOS transistor 132 further includes a drain electrically connected to the drain of the third NMOS transistor 125. The third PMOS transistor 133 further includes a source electrically connected to the drain of the sixth PMOS transistor 136 and a drain electrically connected to the drain of the fourth NMOS transistor 126 and to the gate of the first output NMOS transistor 23 at a voltage output of the first feedback amplifier 121. The third and fourth NMOS transistors 125, 126 each include a gate electrically connected to the third voltage reference $V_{REF3}$. The third NMOS transistor 125 further includes a source electrically connected to a drain and a gate of the fifth NMOS transistor 127 and to a gate of the sixth NMOS transistor 128. The fifth and sixth NMOS transistors 127, 128 each include a source electrically connected to the first supply voltage $V_1$. The sixth NMOS transistor 128 further includes a drain electrically connected to a source of the fourth NMOS transistor 126.

The second feedback amplifier 122 includes seventh to twelfth NMOS transistors 143-148, seventh to twelfth PMOS transistors 151-156, and a sixth current source 158. The seventh NMOS transistor 143 includes a source electrically connected to the first end of the third current source 27 and to the drain of the second input PMOS transistor 22 at a first current input of the second feedback amplifier 122. The seventh NMOS transistor 143 further includes a gate electrically connected to the gate of the eighth NMOS transistor 144, to a drain of the seventh PMOS transistor 151, and to a first end of the sixth current source 158. The sixth current source 158 further includes a second end electrically connected to the first supply voltage $V_1$. The seventh NMOS transistor 143 further includes a drain electrically connected to a drain of the tenth PMOS transistor 154 and to a source of the eighth PMOS transistor 152. The eighth NMOS transistor 144 further includes a source electrically connected to the source of the second input PMOS transistor 22, to the source of the second output NMOS transistor 24, and to the second end of the resistor 34 at a second current input of the second feedback amplifier 122. The eighth NMOS transistor 144 further includes a drain electrically connected to a source of the seventh PMOS transistor 151 and to a drain of the eleventh PMOS transistor 155.

The tenth to twelfth PMOS transistors 154-156 each include a gate electrically connected to the first voltage reference $V_{REF1}$ and a source electrically connected to the second supply voltage $V_2$. The seventh to ninth PMOS transistors 151-153 each include a gate electrically connected to the second voltage reference $V_{REF2}$. The eighth PMOS transistor 152 further includes a drain electrically connected to the drain of the ninth NMOS transistor 145. The ninth PMOS transistor 153 further includes a source electrically connected to the drain of the twelfth PMOS transistor 156 and a drain electrically connected to the drain of the tenth NMOS transistor 146 and to the gate of the second output NMOS transistor 24 at a voltage output of the second feedback amplifier 122. The ninth and tenth NMOS transistors 145, 146 each include a gate electrically connected to the third voltage reference $V_{REF3}$. The ninth NMOS transistor 145 further includes a source electrically connected to a drain and gate of the eleventh NMOS transistor 147 and to a gate of the tenth NMOS transistor 148. The eleventh and twelfth NMOS transistors 147, 148 each include a source electrically connected to the first supply voltage $V_1$. The twelfth NMOS transistor 148 further includes a drain electrically connected to a source of the tenth NMOS transistor 146.

The first and second feedback amplifiers 121, 122 can be used to control the difference in voltage between the drain and the source of the first and second input PMOS transistors 21, 22, respectively. For example, the first feedback amplifier 121 can be used to control the voltage of the gate of the first output NMOS transistor 23 based on the difference in voltage between the drain and source of the first input PMOS transistor 21, and the second feedback amplifier 122 can be used to control the voltage of the gate of the second output NMOS transistor 24 based on the difference in voltage between the drain and source of the second input PMOS transistor 22.

The first and second feedback amplifiers 121, 122 can be configured to have an offset voltage about equal to the desired value of the drain-source voltage of the first and second input PMOS transistors 21, 22, respectively. Additionally, the first and second feedback amplifiers 121, 122 can be configured to adjust the gate voltage of the first and second output NMOS transistors 23, 24, respectively, until the difference between the drain and source voltages of the first and second input PMOS transistors 21, 22 is about equal to the offset voltage of the first and second feedback amplifiers 121, 122.

In one embodiment, the first and second feedback amplifiers 121, 122 are each configured to have a voltage offset in the range of about 200 mV to about 400 mV. The first and second feedback amplifiers 121, 122 can be configured to have a voltage offset using any suitable technique. In one implementation, the offset of the first and second feedback amplifiers 121, 122 is achieved by selecting the width and/or length of the first and seventh NMOS transistors 123, 143 relative to the width and/or length of the second and eighth NMOS transistor 124, 144. For example, in one implementation, the second and eighth NMOS transistors 124, 144 have a width-to-length ratio that is about 2 times to about 200 times greater than the width-to-length ratio of the first and seventh NMOS transistors 123, 143.

The illustrated first and second feedback amplifiers 121, 122 use a folded current mirror structure to aid in improving the input voltage range of the transconductance amplification block 120. For example, the second and fourth PMOS transistors 132, 134 in the first feedback amplifier 121 and the eighth and tenth PMOS transistors 152, 154 in the second feedback amplifier 122 have been arranged to operate as folded-cascode current mirrors. By using folded current mirror circuitry, the operating input voltage range of the transconductance amplification block 120 can be improved.

In one embodiment, the first and second output NMOS transistors 23, 24 are low threshold voltage MOS devices. In certain implementations, at least of portion of the NMOS transistors in the first and second feedback amplifiers 121, 122 are low threshold voltage MOS devices to aid in improving input voltage range of the transconductance amplification block 120. For example, the first and seventh NMOS transistors 123, 143 and/or the second and eight NMOS transistors 124, 144 can be low threshold voltage NMOS devices.

The magnitude of the fifth and sixth current sources 157, 158 can be any suitable value. In one embodiment, the fifth and sixth current sources 157, 158 each have a current magnitude in the range of about 10 nA to about 0.1 mA. However, other current magnitudes will be readily determined by one of skill in the art.

The first, second and third reference voltages $V_{REF1}$-$V_{REF3}$ can be biased at any suitable voltage level. In one embodiment, the voltage level of the first reference voltage $V_{REF1}$ is selected to be in the range of about 0.1 V to about 2 V less than the second supply voltage $V_2$, the voltage level of the second reference voltage $V_{REF2}$ is selected to be in the range of about 0.2 V to about 2 V less than the second supply voltage $V_2$, and the voltage level of the third reference voltage $V_{REF3}$ is selected to be in the range of about 0.2 V to about 2 V more than the first supply voltage $V_1$. However, other voltage levels will be readily determined by one of skill in the art.

Figure 5:
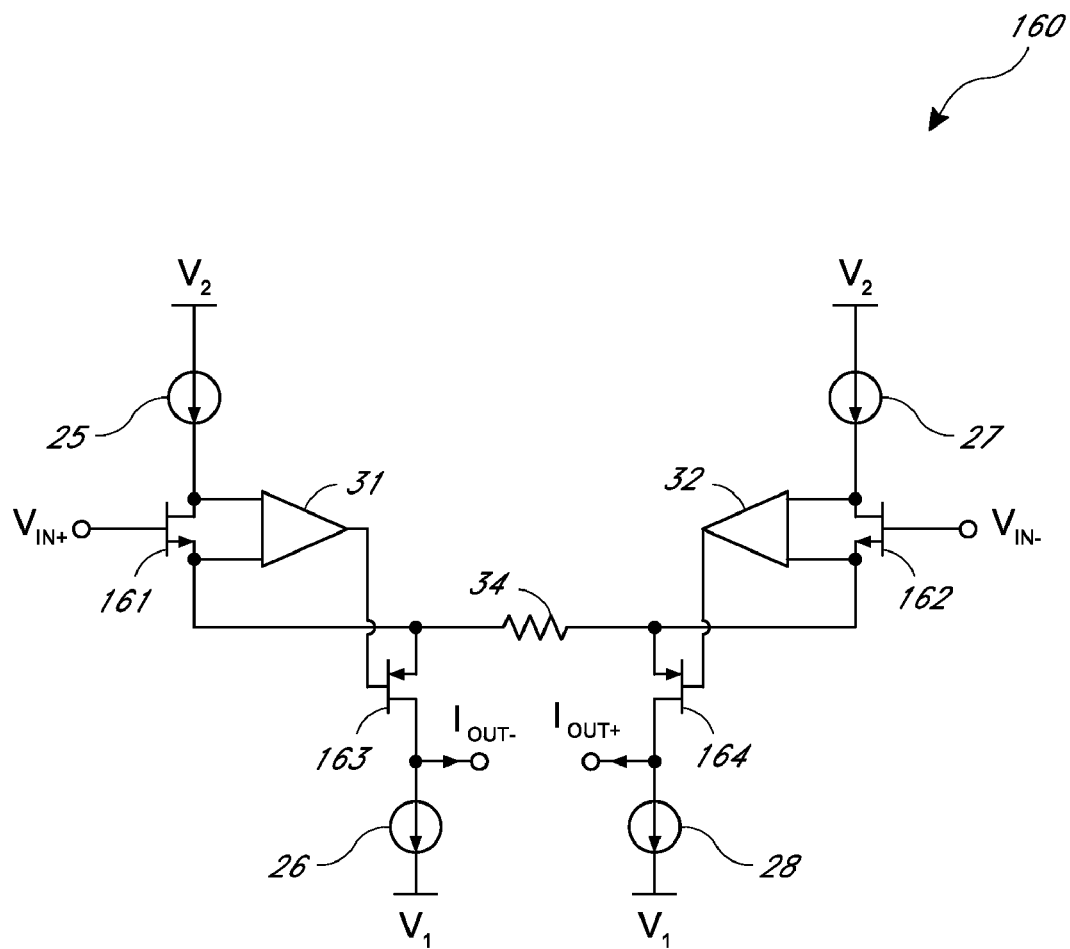
FIG. 5 is a circuit diagram of a transconductance amplification block according to yet another embodiment.

Although FIGS. 2A-4 have described transconductance amplification blocks in the context of p-type input transistors, the biasing schemes described herein can be implemented using n-type input transistors. For example, the transconductance amplification blocks described above with reference to FIGS. 2A-4 can be modified to achieve complementary NMOS input transistor configurations. FIG. 5 illustrates one such example of a transconductance amplification block using NMOS input transistors.

FIG. 5 is a circuit diagram of a transconductance amplification block 160 according to yet another embodiment. The transconductance amplification block 160 includes first and second input NMOS transistors 161, 162, first and second output PMOS transistors 163, 164, the first and second feedback amplifiers 31, 32, the first to fourth current sources 25-28, and the resistor 34. The transconductance amplification block 160 includes the non-inverted voltage input $V_{IN+}$, the inverted voltage input $V_{IN-}$, the non-inverted current output $I_{OUT+}$, and the inverted current output $I_{OUT-}$.

The first input NMOS transistor 161 includes a drain electrically connected to a first end of the first current source 25 and to a first input of the first feedback amplifier 31, a gate electrically connected to the non-inverted voltage input $V_{IN+}$, and a source electrically connected to a second input of the first feedback amplifier 31, to a source of the first output PMOS transistor 163, and to a first end of the resistor 34. The first current source 25 includes a second end electrically connected to the second supply voltage $V_2$. The first output PMOS transistor 163 further includes a gate electrically connected to an output of the first feedback amplifier 31 and a drain electrically connected to the inverted current output $I_{OUT-}$ and to a first end of the second current source 26. The second current source 26 further includes a second end electrically connected to the first supply voltage $V_1$.

The second input NMOS transistor 162 includes a drain electrically connected to a first end of the third current source 27 and to a first input of the second feedback amplifier 32, a gate electrically connected to the inverted voltage input $V_{IN-}$, and a source electrically connected to a second input of the second feedback amplifier 32, to a source of the second output PMOS transistor 164, and to a second end of the resistor 34. The second output PMOS transistor 164 further includes a gate electrically connected to an output of the second feedback amplifier 32 and a drain electrically connected to the non-inverted current output $I_{OUT+}$ and to a first end of the fourth current source 28. The third current source 27 includes a second end electrically connected to the second supply voltage $V_2$, and the fourth current source 28 further includes a second end electrically connected to the first supply voltage $V_1$.

The first and second feedback amplifiers 31, 32 can be used to control the drain-source voltages of the first and second input NMOS transistors 161, 162, respectively. For example, the first and second feedback amplifiers can be configured to control the gate voltage of the first and second output PMOS transistors 163, 164, and thus the drain currents of the first and second input NMOS transistors 161, 162, based on the drain-source voltages of the first and second input NMOS transistors 161, 162, respectively. Additional details of the transconductance amplification block 160 can be similar to that described earlier with respect to FIGS. 2A-4.

FIG. 5 illustrates a complimentary implementation of the transconductance amplification block 20 of FIG. 2A. Skilled artisans will appreciate that the biasing schemes shown in FIGS. 2B-4 using p-type input transistors can be implemented in a complimentary configuration that uses n-type input transistors.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
a first transconductance amplifier having a first voltage input, a second voltage input, a first current output, and a second current output, the first transconductance amplifier comprising:
a resistor;
a first transistor having a gate, a drain, and a source, the gate electrically connected to the first voltage input;
a second transistor having a gate, a drain, and a source, the gate electrically connected to the second voltage input, wherein the first and second transistors are configured to generate a voltage across the resistor resulting in a current, wherein a difference in output currents between the first and second current outputs corresponds to the current;
a first amplifier having a first input, a second input, and an output, the first and second inputs electrically connected to the drain and to the source of the first transistor, respectively;
a third transistor having a gate, a drain, and a source, wherein the drain and the source of the third transistor are disposed in a signal path between the source of the first transistor and the first current output, and wherein the first amplifier is configured to control the voltage of the gate of the third transistor so as to control a difference in voltage between the drain and the source of the first transistor;
a second amplifier having a first input, a second input, and an output, the first and second inputs electrically connected to the drain and to the source of the second transistor, respectively; and
a fourth transistor having a gate, a drain, and a source, wherein the drain and the source of the fourth transistor are disposed between the source of the second transistor and the second current output, and wherein the second amplifier is configured to control the voltage of the gate of the fourth transistor so as to control a difference in voltage between the drain and the source of the second transistor.

2. The apparatus of claim 1, wherein the first amplifier has a first offset voltage and the second amplifier has a second offset voltage, and wherein the first amplifier is configured to control the voltage of the gate of the third transistor such that a magnitude of a voltage difference between the source and the drain of the first transistor is equal to about the first offset voltage, and wherein the second amplifier is configured to control the voltage of the gate of the fourth transistor such that a voltage difference between the source and the drain of the second transistor is equal to about the second offset voltage.

3. The apparatus of claim 2, wherein the first and second offset voltages are in the range of about 200 mV to about 400 mV.

4. The apparatus of claim 1, wherein the first and second inputs of the first and second amplifiers are current inputs.

5. The apparatus of claim 4, wherein the first amplifier comprises a first n-type metal oxide semiconductor (NMOS) transistor, a second NMOS transistor, a first current mirror, and a first current source, wherein the first NMOS transistor includes a source electrically connected to the first input of the first amplifier, a drain electrically connected to an input of the first current mirror, and a gate electrically connected to a gate and a drain of the second NMOS transistor and to the first current source, and wherein the second NMOS transistor further includes a source electrically connected to the second input of the first amplifier.

6. The apparatus of claim 5, wherein the first amplifier further comprises a second current source, wherein the output of the first current mirror is electrically connected to the second current source and to the output of the first amplifier.

7. The apparatus of claim 5, wherein a magnitude of a threshold voltage of the first and second NMOS transistors is about 200 mV to about 1.5 V less than a threshold voltage of the first and second transistors.

8. The apparatus of claim 5, wherein the current mirror is a folded-cascode current mirror.

9. The apparatus of claim 1, wherein the first and second transistors are p-type metal oxide semiconductor (PMOS) transistors.

10. The apparatus of claim 9, wherein third and fourth transistors are NMOS transistors.

11. The apparatus of claim 9, wherein third and fourth transistors are PMOS transistors.

12. The apparatus of claim 1, wherein the source of the third transistor is electrically connected to the source of the first transistor and the drain of the third transistor is electrically connected to the first current output, and wherein the source of the fourth transistor is electrically connected to the source of the second transistor and the drain of the fourth transistor is electrically connected to the second current output.

13. The apparatus of claim 12, wherein a magnitude of a threshold voltage of the third and fourth transistors is about 200 mV to about 1.5 V less than a threshold voltage of the first and second transistors.

14. The apparatus of claim 1, wherein the drain of the third transistor is electrically connected to the source of the first transistor and the source of the third transistor is electrically connected to the first current output, and wherein the drain of the fourth transistor is electrically connected to the source of the second transistor and the source of the fourth transistor is electrically connected to the second current output.

15. The apparatus of claim 1, wherein the resistor includes a first end electrically connected to the source of the first transistor and a second end electrically connected to the source of the second transistor.

16. The apparatus of claim 1, further comprising a first current source electrically connected to the drain of the first transistor and a second current source electrically connected to the drain of the second transistor.

17. The apparatus of claim 16, wherein the first and second current sources each have an output impedance that is greater than about 100 kΩ.

18. The apparatus of claim 1, wherein the first transistor is biased with a first bias current and the second transistor is biased with a second bias current, and wherein at least a portion of the first bias current is configured to pass through the third transistor and at least a portion of the second bias current is configured to pass through the fourth transistor.

19. The apparatus of claim 1, further comprising:
a second transconductance amplifier including a first voltage input, a second voltage input, a first current output, and a second current output; and
a transimpedance amplifier including a first current input, a second current input and a voltage output, wherein the first current input is electrically connected to the first current output of the first transconductance amplifier and to the second current output of the second transconductance amplifier, and wherein the second current input is electrically connected to the second current output of the first transconductance amplifier and to the first current output of the first transconductance amplifier.

20. A method of biasing a transconductance amplifier, the method comprising:
amplifying a differential input voltage using a first metal oxide semiconductor (MOS) transistor and a second MOS transistor to generate a voltage across a resistor;
generating a current using the resistor based on the voltage across the resistor, wherein at least a portion of the current is configured to pass through a source and a drain of a third MOS transistor and through a source a drain of fourth MOS transistor to generate a differential output current;
controlling a voltage of the gate of the third MOS transistor using a first amplifier having a first input electrically coupled to a source of the first MOS transistor and a second input electrically coupled to a drain of the first MOS transistor, wherein the first amplifier controls the gate of the third MOS transistor so as to control a difference in voltage between the drain and the source of the first MOS transistor; and
controlling a voltage of the gate of the fourth MOS transistor using a second amplifier having a first input electrically coupled to a source of the second MOS transistor and a second input electrically coupled to a drain of the second MOS transistor, wherein the second amplifier controls the gate of the fourth MOS transistor so as to control a difference in voltage between the drain and the source of the second MOS transistor.

21. An apparatus, comprising:
a first transconductance amplifier having a first voltage input, a second voltage input, a first current output, and a second current output, the first transconductance amplifier comprising:
a resistor;
a first transistor having a gate, a drain, and a source, the gate electrically connected to the first voltage input;
a second transistor having a gate, a drain, and a source, the gate electrically connected to the second voltage input, wherein the first and second transistors are configured to generate a voltage across the resistor resulting in a current, wherein a difference in output currents between the first and second current outputs corresponds to the current;
a first means for controlling having a first input, a second input, and an output, the first and second inputs electrically connected to the drain and to the source of the first transistor, respectively;
a third transistor having a gate, a drain, and a source, wherein the drain and the source of the third transistor are disposed in a signal path between the source of the first transistor and the first current output, and wherein the first controlling means is configured to control the voltage of the gate of the third transistor so as to control a difference in voltage between the drain and the source of the first transistor;
a second means for controlling having a first input, a second input, and an output, the first and second inputs electrically connected to the drain and to the source of the second transistor, respectively; and
a fourth transistor having a gate, a drain, and a source, wherein the drain and the source of the fourth transistor are disposed between the source of the second transistor and the second current output, and wherein the second controlling means is configured to control the voltage of the gate of the fourth transistor so as to control a difference in voltage between the drain and the source of the second transistor.

22. The apparatus of claim 21, wherein the first controlling means has a first offset voltage and the second controlling means has a second offset voltage, and wherein the first controlling means is configured to control the voltage of the gate of the third transistor such that a magnitude of a voltage difference between the source and the drain of the first transistor is equal to about the first offset voltage, and wherein the second controlling means is configured to control the voltage of the gate of the fourth transistor such that a magnitude of voltage difference between the source and the drain of the second transistor is equal to about the second offset voltage.

23. The apparatus of claim 21, wherein the first and second inputs of the first and second controlling means are current inputs.

24. The apparatus of claim 21, wherein the first and second transistors are p-type metal oxide semiconductor (PMOS) transistors.

* * * * *

UNITED STATES PATENT AND TRADEMARK OFFICE
CERTIFICATE OF CORRECTION

PATENT NO. : 8,319,553 B1
APPLICATION NO. : 13/196523
DATED : November 27, 2012
INVENTOR(S) : Ivanov It is certified that error appears in the above-identified patent and that said Letters Patent is hereby corrected as shown below:

In the Specifications

In column 2 at line 5, Change "a source a drain" to --a source and a drain--.

In the Claims

In column 19 at line 50, In Claim 20, change "a source a drain" to --a source and a drain--.

Signed and Sealed this
Twenty-eighth Day of May, 2013

Teresa Stanek Rea
*Acting Director of the United States Patent and Trademark Office*